United States Patent
Tontisirin et al.

(10) Patent No.: US 12,425,012 B1
(45) Date of Patent: Sep. 23, 2025

(54) DELAY BALANCING LOOP FOR MEASUREMENT OF CAPACITANCE AND DELAY BALANCING LOOP METHOD THEREOF

(71) Applicant: Silicon Craft Technology Public Company Limited, Bangkok (TH)

(72) Inventors: Sitt Tontisirin, Bangkok (TH); Chinnatip Ratametha, Bangkok (TH)

(73) Assignee: Silicon Craft Technology Public Company Limited, Bangkok (TH)

( * ) Notice: Subject to any disclaimer, the term of this patent is extended or adjusted under 35 U.S.C. 154(b) by 57 days.

(21) Appl. No.: 18/611,734

(22) Filed: Mar. 21, 2024

(51) Int. Cl.
  *G01R 27/00* (2006.01)
  *G01R 27/26* (2006.01)
  *H03K 5/14* (2014.01)
  *H03K 5/24* (2006.01)

(52) U.S. Cl.
  CPC .............. *H03K 5/14* (2013.01); *G01R 27/26* (2013.01); *G01R 27/2605* (2013.01); *H03K 5/249* (2013.01)

(58) Field of Classification Search
  CPC .......... H03K 5/14; H03K 5/249; G01R 27/06; G01R 27/2605; G01D 5/24
  See application file for complete search history.

(56) References Cited

U.S. PATENT DOCUMENTS

| | | | | |
|---|---|---|---|---|
| 5,937,023 A * | 8/1999 | Wu | ........................... | G01D 5/24 377/12 |
| 5,990,578 A * | 11/1999 | Krauss | ...................... | G01D 5/24 307/116 |
| 7,598,752 B2 * | 10/2009 | Li | ......................... | H03K 17/962 345/173 |
| 9,500,686 B1 * | 11/2016 | Wilson | ............... | G01R 27/2605 |
| 2011/0137593 A1 * | 6/2011 | Krauss | ...................... | G01D 5/24 702/65 |
| 2014/0267880 A1 * | 9/2014 | Aranovsky | .............. | G03B 3/10 324/686 |
| 2015/0130482 A1 * | 5/2015 | van Lammeren | .... | G01N 27/221 324/682 |
| 2017/0307668 A1 * | 10/2017 | Buffa | .................. | G01R 27/2605 |
| 2018/0340963 A1 * | 11/2018 | Raehse | ..................... | H03K 5/26 |
| 2019/0072597 A1 * | 3/2019 | Walsh | ............... | G06F 3/041661 |
| 2019/0097316 A1 * | 3/2019 | Cruise | ....................... | H01Q 3/22 |
| 2019/0181874 A1 * | 6/2019 | Loveless | ................. | H03K 21/08 |
| 2020/0287526 A1 * | 9/2020 | Das | ........................ | H03K 5/131 |

* cited by examiner

*Primary Examiner* — Tuan T Lam
(74) *Attorney, Agent, or Firm* — Winston Hsu

(57) ABSTRACT

Delay balancing loop for measurement of capacitance and delay balancing loop method thereof is a circuit design by using time-based capacitance sensing method which leads to low power and small area requiring for Radio Frequency Identification (RFID) products. The circuit includes delay cells for sensing sensor's capacitance and for using as a reference capacitance, delay management unit, feedback control unit and output calculation unit.

10 Claims, 5 Drawing Sheets

DELAY BALANCING LOOP FOR MEASUREMENT OF CAPACITANCE AND DELAY BALANCING LOOP METHOD THEREOF

BACKGROUND OF THE INVENTION

1. Field of the Invention

The present invention relates to the field of integrated circuits and methods for measurement of capacitance, and particularly for systems and applications which require low power consumption and small silicon die area.

2. Description of the Prior Art

Capacitive sensors are widely utilized in various technological applications, including industrial automation, proximity detection, touchscreens etc. The capacitive sensors make applications or devices recognizing environmental parameters i.e. moisture, temperature. Nowadays, there are three main techniques for measuring capacitance including voltage and current changing detection technique, charge distribution technique, and time and frequency-based capacitance technique. Each technique has its own unique method to detect capacitance. However, the present invention relates to the time and frequency-based capacitance sensing methods. Therefore, this section will describe only relating methods and inventions. The time and frequency-based capacitance sensing method gained popularity because of its simplicity and direct obtaining digital data. Moreover, it mainly consists of digital circuits that lead to a small area, low voltage, and low current operation. Therefore, previous works on improving the time and frequency-based capacitance sensing are explored.

The U.S. Pat. No. 6,700,392 B2 applied the concept of using time and frequency-based conversion mechanism for capacitance sensing. A relaxation oscillator is used to generate a signal, the frequency of which depends on the capacitance value being sensed. A calculation module uses the generated signal from the relaxation oscillator to determine the capacitance value. However, environmental parameters, such as temperature, affect the oscillation frequency, thereby influencing the accuracy of the measured capacitance value. Therefore, the system needs predetermined calibration signals to correct for the oscillation frequency and the measured capacitance value.

The U.S. Pat. No. 7,119,551 B2 also applied the concept of using time and frequency-based conversion mechanism for capacitance sensing. However, its main purpose is to overcome the signal distortion from protection circuits by applying a filter and an additional path to reduce the distortion of the oscillation signal, but this invention still requires the predetermined calibration process.

The U.S. Pat. No. 10,473,493 B2 utilizes the time and frequency-based conversion method by using two ring oscillators. One of the oscillators is used for sensing, and its oscillation frequency changes in dependence on the sensing capacitance. The other oscillator is used as a reference oscillator, and its oscillation frequency is adjustable by a control signal. The system is arranged in a closed control loop to adjust the frequency of the reference oscillator to maintain a given relation between the oscillation frequencies of the two oscillators. As a result, the control signal, which is implementable as a digital signal, can represent the measured capacitance value. With the closed-loop system, the resulting capacitance value can be calculated from a reference component and the control signal of the reference oscillator; therefore, the predetermined calibration process can be avoided. However, it requires two oscillators leading to larger chip area and higher power consumption.

To address these challenges, there is a need to develop a circuit or method that can be used to measure a capacitance accurately without the need of a predetermined calibration process. Such a circuit or method should have low power consumption, small area and easy to set up and minimize the complexity of circuits, while providing a significant improvement in measurement of capacitance.

SUMMARY OF THE INVENTION

The present invention described herein generally relates to a delay balancing loop for measurement of capacitance and delay balancing loop method thereof. The delay balancing loop comprises delay cells for capacitance sensing and capacitance referencing in the system, delay management unit, feedback control unit and output calculation unit.

The general purpose of the present invention is to create a circuit and method which requires low power consumption, small area of circuit and improving sensing capability of the circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
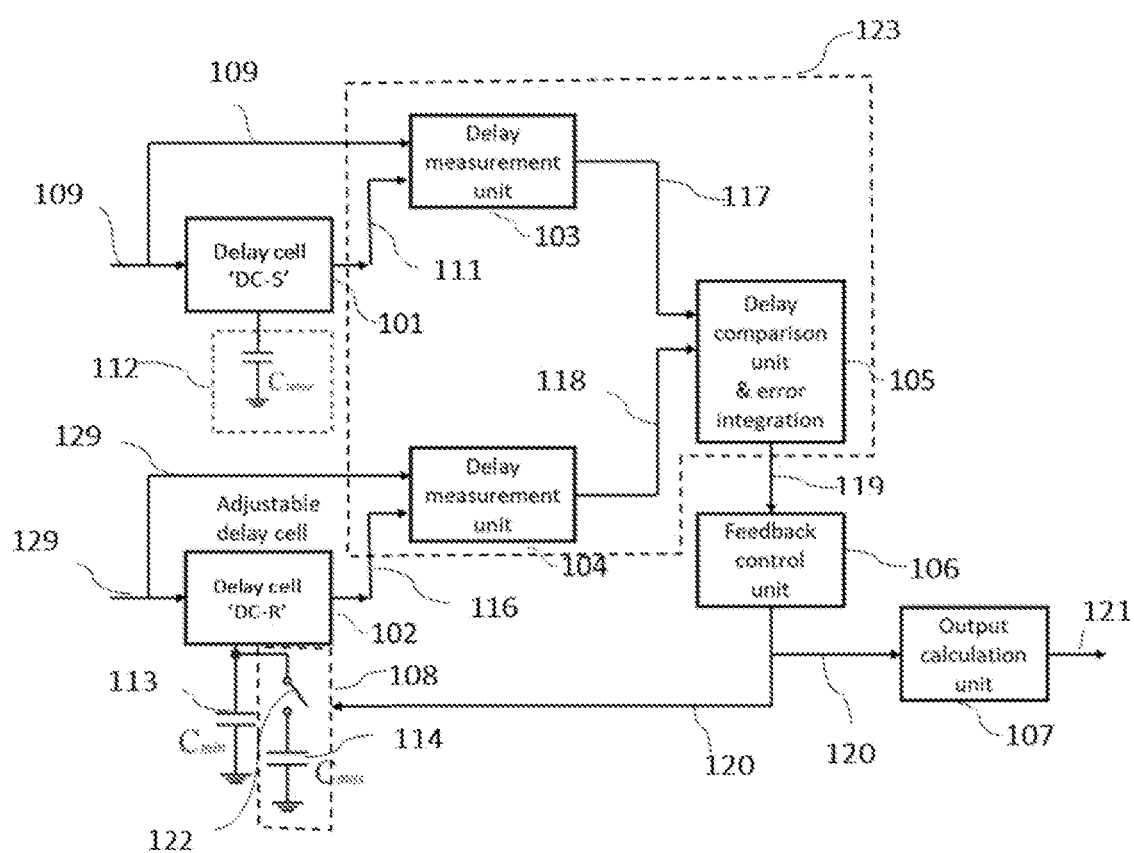
FIG. 1 is a block diagram of delay balancing loop for measurement of capacitance and delay balancing loop method thereof.

FIG. 1 shows a block diagram of an exemplary delay balancing loop for measurement of capacitance and delay balancing loop method thereof, which comprises at least two delay cells 101 and 102, at least one delay management unit 123, at least one feedback control unit 106, at least one output calculation unit 107, and at least one mean 108 to adjust delay time. An input signal 109 is delayed by the delay cell (DC-S) 101 and its delay time depends on the capacitance value of a capacitor Csense 112. A larger Csense capacitance results in a larger delay time between the input signal 109 and the output signal 111 of the delay cell (DC-S)

101. The Csense capacitance may be derived from an external transducer which converts environmental parameter to electrical parameter. The external transducer may be implemented by inter-digitate electrodes and applied for converting moisture and human's touch to the change of Csense capacitance. An input signal 129 is delayed by the delay cell (DC-R) 102 and its delay time is dependent on the mean 108. The mean 108 may include switches and capacitors or varactors. Referring to the embodiment in FIG. 1, the mean 108 comprises a switch 122 with a capacitor Cmax 114. The delay time of the delay cell (DC-R) 102 depends on the capacitance value from a capacitor Cmin 113, the capacitance of the capacitor Cmax 114, and the switch 122. The delay time of the delay cell (DC-R) 102 follows two patterns of the mean 108. If the switch 122 in the mean 108 is opened, the delay time of the delay cell (DC-R) 102 will be shorter which is defined by the capacitance of the capacitor Cmin 113. If the switch 122 in the mean 108 is closed, the delay time of the delay cell (DC-R) 102 will be longer which is defined by the capacitance of the capacitor Cmin 113 and the capacitance from the capacitor Cmax 114. These processes make the delay time between the signal 129 and signal 116 adjustable by the signal 120. If the mean 108 is the switch 122 with the capacitor 114, the signal 120 may be a digital signal. In the moisture sensing application, the capacitor Csense 112 may be implemented by an external transducer and the capacitance of the capacitor Csense 112 may change in the range of a few hundred femtofarad (fF) to a few picofarad (pF). In one embodiment, where the range of capacitance of the capacitor Csense 112 is from a few hundred of fF to a few pF, the capacitance value of the capacitor Cmin 113 may be in the range of 0 to 100 fF and the capacitance value of the capacitor Cmax 114 may be in the range of 2 to 3 pF. The delay management unit 123 comprises at least two delay measurement units 103 and 104, at least one delay comparison and error accumulation unit 105. The delay management unit 123 is configured to measure the delay times of the delay cell (DC-S) 101 and the delay cell (DC-R) 102, compare the measured delay times to calculate the difference of the delay times and accumulate those differences. Referring to FIG. 1, the delay measurement unit 103 measures the delay time between the input signal 109 and the output signal 111 of the delay cell (DC-S) 101 and generates an impulse output signal 117. The duration of the impulse output signal 117 is equal to the delay time of the delay cell (DC-S) 101, which is dependent on the capacitance of the capacitor Csense 112. The duration of the impulse output signal 117 is larger when the capacitance of the capacitor Csense 112 is large and the duration of the impulse output signal 117 is smaller when the capacitance of the capacitor Csense 112 is small. The delay measurement unit 104 measures the delay time between the input signal 129 and the output signal 116 of the delay cell (DC-S) 102 and generates an impulse output signal 118. The duration of the impulse output signal 118 is equal to the delay time of the delay cell (DC-R) 102, which is dependent on the mean 108. The duration of the impulse output signal 118 is smaller when the switch 122 of the mean 108 is opened. The duration of the impulse output signal 118 is larger when the switch 122 of the mean 108 is closed. The delay comparison and error accumulation unit 105 compares the impulse output signals 117 and 118. In one embodiment, the delay comparison and error accumulation unit 105 may include a logic gate such "XOR" gate or "XNOR" gate to calculate the difference of the duration of the impulse output signals 117 and 118. The delay comparison and error accumulation unit 105 accumulates the differences of the duration of the impulse output signals 117 and 118 and generates an output signal 119. The output signal 119 is sent to the feedback control unit 106 to adjust the delay time between the input signal 129 and the output signal 116 of the delay cell (DC-R) 102 by using the output signal 120 from the feedback control unit 106. In one embodiment, the output signal 120 may be a digital signal. The feedback control unit 106 controls the average delay time between the input signal 129 and the output signal 116 of the delay cell (DC-R) 102 to be equal to the delay time between the input signal 109 and output signal 111 of the delay cell (DC-S) 101 by sending the output signal 120 to control the mean 108 with two patterns. In a first pattern, the output signal 120 may be a digital logic '1', the switch 122 of the mean 108 is closed to connect the capacitor Cmax 114 to the delay cell (DC-R) 102. In a second pattern, the output signal 120 may be a digital logic '0', the switch 122 in the mean 108 is opened to disconnect the capacitor Cmax 114 from the delay cell (DC-R) 102. Then the output calculation unit 107 generates an output signal Dout 121 from the output signal 120. Referring to FIG. 1, the delay balancing loop operates in a such manner that the duration during which the output signal 120 is equal to the digital logic '1' is larger when the capacitance of the capacitor Csense 112 is large, and the duration during which the output signal 120 is equal to the digital logic '1' is smaller when the capacitance of the capacitor Csense 112 is small. Therefore, the output calculation unit 107 measures the duration during which the output signal 120 is equal to the digital logic '1' and generates an output signal 121 to represent the capacitance of the capacitor Csense 112. In one embodiment, the output calculation unit 107 may be a counter.

Figure 2:
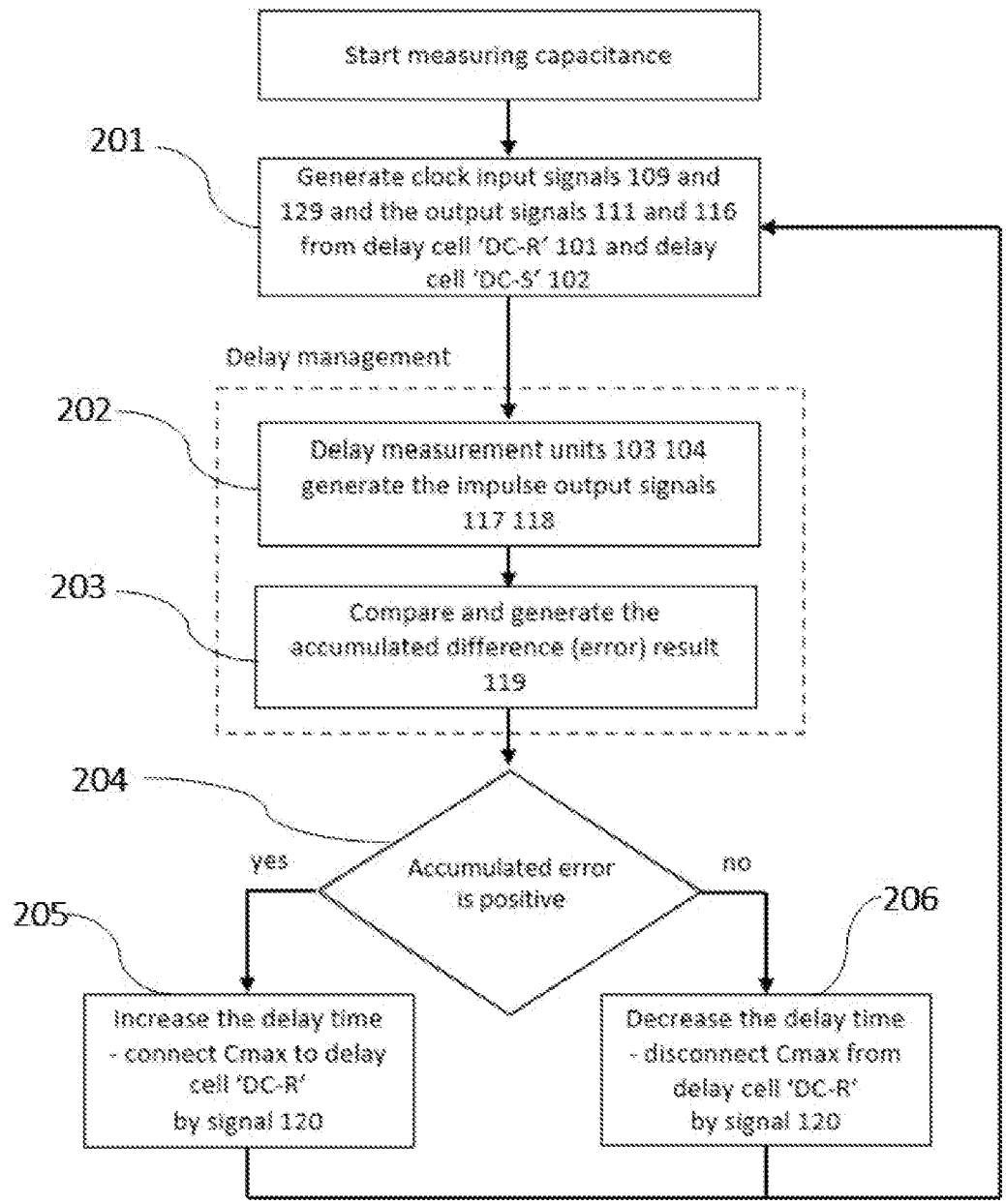
FIG. 2 is a flowchart of delay balancing loop for measurement of capacitance and delay balancing loop method thereof.

FIG. 2 shows an operation flowchart of the delay balancing loop for measurement of capacitance and delay balancing loop method thereof. The operation begins in step 201 by generating the input signal 109, the input signal 129, the output signal 111 from the delay cell (DC-S) 101, and generating the output signal 116 from the delay cell (DC-R) 102. The signals 109, 111 and 116 are sent to the delay management unit 123, which performs delay measurement, comparison, and difference (error) accumulation. In step 202, the delay time of the delay cell (DC-S) 101 is measured by the delay measurement unit 103 to generate the impulse output signal 117 and the delay time of the delay cell (DC-R) 102 is measured by the delay measurement unit 104 to generate the impulse output signal 118. In steps 203 and 204, the delay comparison and error accumulation unit 105 calculates the difference of the duty cycle of the impulse output signals 117 and 118 and accumulates the difference to generate the output signal 119. In step 205, the output signal 119 is positive when the duty cycle of the impulse output signal 117 is larger than the duty cycle of the impulse output signal 118, which implies that the average delay time of the delay cell (DC-S) 101 is larger than the average delay time of the delay cell (DC-R) 102. In this case, the feedback control unit 106 increases the delay time of the delay cell (DC-R) 102 by sending the output signal 120 to control the mean 108 to connect the capacitor Cmax 114 to the delay cell (DC-R) 102. In step 206, the output signal 119 is negative when the duty cycle of the impulse output signal 117 is smaller than the duty cycle of the impulse output signal 118, which implies that the average delay time of the delay cell (DC-S) 101 is smaller than the average delay time of the delay cell (DC-R) 102. In this condition, the feedback control unit 106 decreases the delay time of the delay cell (DC-R) 102 by sending the output signal 120 to control the mean 108 to disconnect the capacitor Cmax 114 from the delay cell (DC-R) 102. The system continuously generates the signal 109, the signal 129, the output signal 111 from the delay cell (DC-S) 101, and the output signal 116 from the delay cell (DC-R) 102 to send to the delay comparison and error accumulation unit 105 accordingly until the average delay time of the cell (DC-S) 101 and the average delay time of the cell (DC-R) 102 are equal. When the delay balancing loop has reached a steady state, the duty cycle of the output signal 120 represents the capacitance of the measured capacitor Csense 112.

Figure 3:
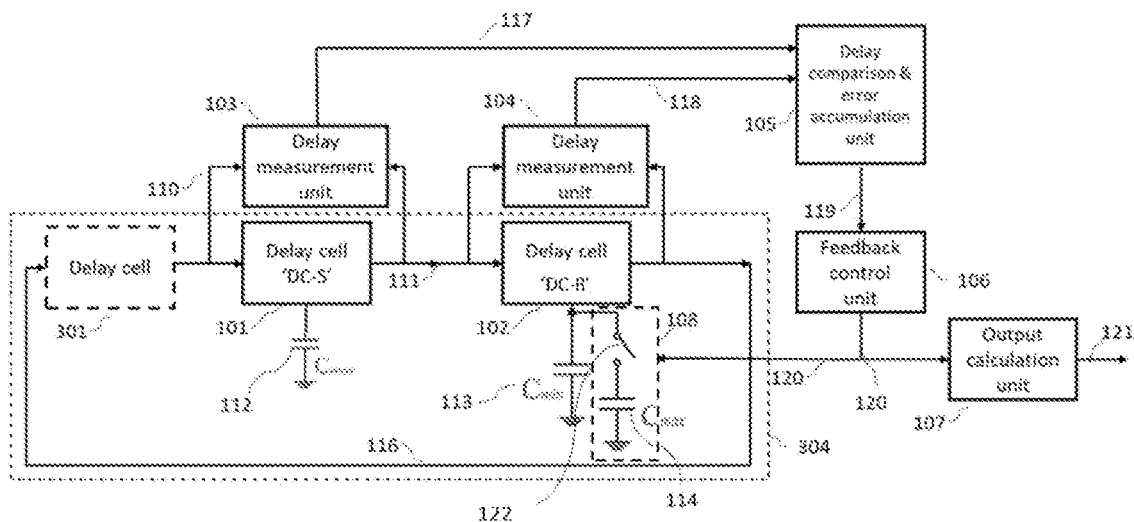
FIG. 3 is an exemplary implementation of delay balancing loop for measurement of capacitance and delay balancing loop method thereof as a ring oscillator.

FIG. 3 shows an example implementation of delay balancing loop for measurement of capacitance and delay balancing loop method thereof as a ring oscillator by connecting delay cells to be a ring oscillator. The embodiment comprises at least one delay cell (DC-S) 101, at least one delay cell (DC-R) 102, at least one delay cell 301, at least two delay measurement unit 103 and 104, at least one delay comparison and error accumulation unit 105, at least one feedback control unit 106, at least one output calculation unit 107, and at least a mean 108. In this embodiment, the delay cell (DC-S) 101 generates the output signal 111 by using the capacitor Csense 112, which may be an external transducer, to delay the input signal 110. The input signal 110 and the output signal 111 are sent to the delay measurement unit 103 to generate the output signal 117 and the output signal 111 is connected to the delay cell (DC-R) 102. The delay cell (DC-R) 102 uses the output signal 111 as an internal input signal to generate the output signal 116 which its delay depends on the capacitance of the capacitor Cmin 113 and the mean 108, which is the switch 122 with the capacitor Cmax 114. The output signal 111 and the output signal 116 will be sent to the delay measurement unit 104 to generate the output signal 118. The delay cell 301 uses the signal 116 as its input signal to generate the output signal 110. The output signal 110 from the delay cell 301 is connected to the delay cell (DC-S) 101 as its input signal. Thus, the delay cell (DC-S) 101, the delay cell (DC-R) 102 and the delay cell 301 are arranged to form a ring oscillator 304. Similar to the delay balancing loop for measurement of capacitance and delay balancing loop method thereof as described in FIG. 1, the output signal 117 and the output signal 118 are sent to the delay comparison and error accumulation unit 105 to compare both the output signal 117 and the output signal 118 to find the differences of both impulses, then such differences will be accumulated, resulting in the output signal 119. Then the output signal 119 is sent to the feedback control unit 106 to decide and adjust the delay time of the output signal 116 of the delay cell (DC-R) 102 by controlling the mean 108 based on the output signal 119, resulting in an output signal 120. The output signal 120 is sent to the output calculation unit 107 to calculate the output result 121 from the feedback signal 120.

Figure 4:
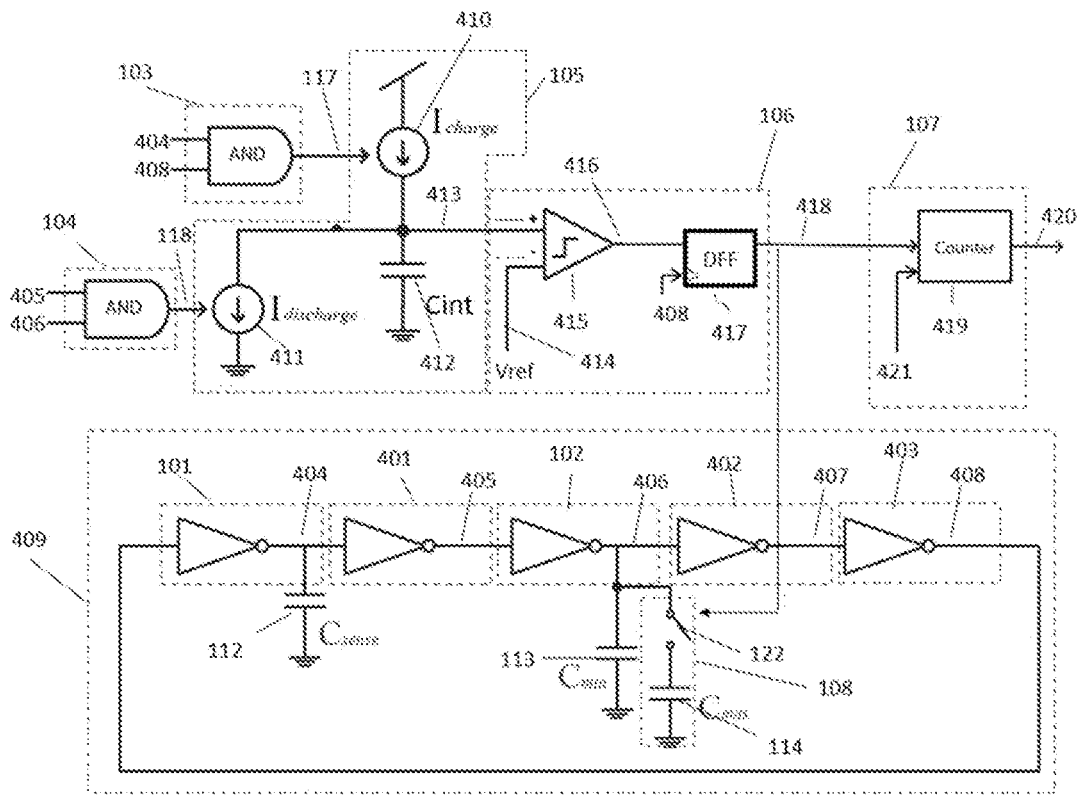
FIG. 4 is a circuit diagram of an exemplary implementation of delay balancing loop for measurement of capacitance and delay balancing loop method thereof as a ring oscillator.

FIG. 4 shows a circuit diagram of an exemplary implementation of delay balancing loop for measurement of capacitance and delay balancing loop method thereof as a ring oscillator. The embodiment comprises at least one delay cell (DC-S) 101, at least one delay cell (DC-R) 102, at least three delay cells 401, 402 and 403, at least two delay measurement units 103 and 104, at least one delay comparison and error accumulation unit 105, at least one feedback control unit 106, at least one output calculation unit 107, and at least one mean 108. In this embodiment all the delay cells 101, 102, 401, 402 and 403 are implemented as inverters and connecting as a loop. The delay cell (DC-S) 101 is connected to the capacitor Csense 112 which may be an external transducer. The delay time of the delay cell (DC-S) 101 is dependent on the capacitance of the capacitor Csense 112.

The output signal 404 of the delay cell (DC-S) 101 is connected to the delay cell 401 as an input of the delay cell 401 to generate an output signal 405. The output signal 405 is connected to the delay cell (DC-R) 102 as an input of the delay cell (DC-R) 102 to generate an output signal 406. The delay time of the delay cell (DC-R) 102 is dependent on the capacitance of the capacitor Cmin 113 and the mean 108, which is the switch 122 and the capacitor Cmax 114. The output signal 406 is connected to the delay cell 402 as an input of the delay cell 402 to generate an output signal 407. The output signal 407 is connected to the delay cell 403 as an input of the delay cell 403 to generate an output signal 408. The output signal 408 is connected to the delay cell (DC-S) 101. Thus, the delay cells 101, 401, 102, 402, and 403 are arranged to implement a ring oscillator 409. The delay cells 401, 402 and 403 are served as signal buffers and create an inverting feedback signal to form an oscillation loop. The output signals 404 and 408 are sent to the delay measurement unit 103 to generate the output signal 117 by using a first AND logic gate 103. The output signals 405 and 406 are sent to the delay measurement unit 104 to generate the output signal 118 by using a second AND logic gate 104. Then the output signal 117 and the output signal 118 are compared, and their differences are accumulated by controlling a current source I-charge 410 and a current sink I-discharge 411 which are configured inside the delay comparison and error accumulation unit 105. The current source I-charge 410 is controlled by the signal 117 and configured to add electron charges into a capacitor Cint 412. The current source I-discharge 411 is controlled by the signal 118 and configured to remove electron charges from the capacitor Cint 412. The electron charges from the current source I-charge 410 and the current source I-discharge 411 represent the durations of the output signal 117 and the output signal 118. The resulting electron charges in the capacitor Cint 412 create an accumulated signal 413 (Vint).

The signal 413 (Vint) is sent to the feedback control unit 106 to compare with a reference voltage level (Vref) 414 by using a comparator 415, resulting in an output signal 416. The output signal 416 is used to decide whether the delay time of the delay cell (DC-R) 102 should be decreased or increased. The output signal 416 is held for one oscillation period by using an D-flipflop 417 inside the feedback control unit 106 to generate a feedback signal 418. The feedback signal 418 controls the mean 108 to increase or decrease the delay time of the delay cell (DC-R) 102. When the delay balancing loop has reached a steady state, the average delay time of the delay cell (DC-R) 102 is equal to the average delay time of the delay cell (DC-S) 101. Then the output calculation unit 107, which is implemented by a counter circuit 419 with an external clock 421, calculates the duration of the feedback control signal 418 that is equal to logic '1' and resulting in an output signal 420 which can represent the capacitance of the measured capacitor Csense 112.

Figure 5:
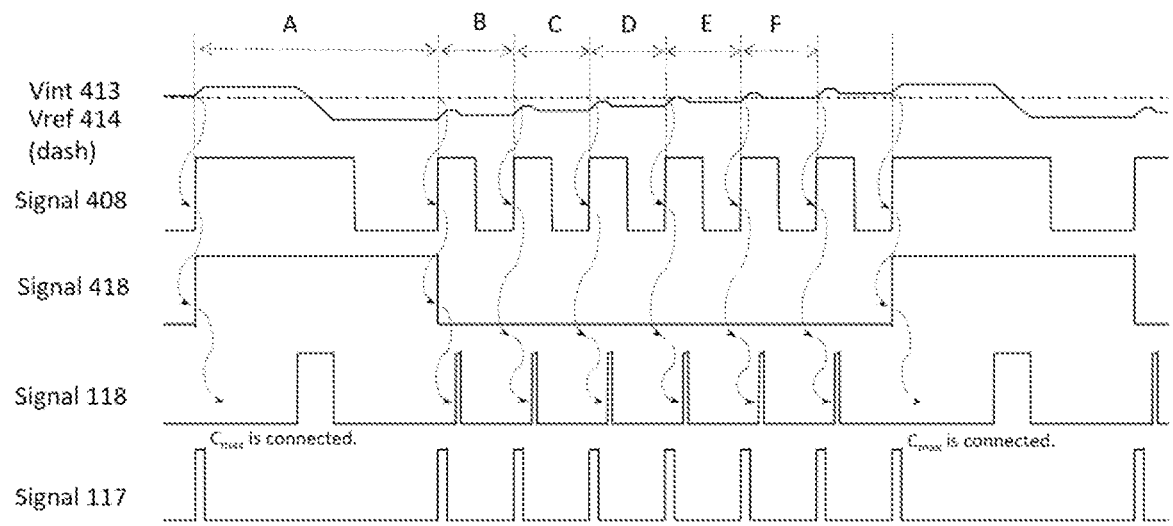
FIG. 5 is an exemplary internal signals delay balancing loop for measurement of capacitance and delay balancing loop method thereof, for small Csense according to FIG. 4.

FIG. 5 shows exemplary internal signals of delay balancing loop for measurement of capacitance and delay balancing loop method thereof in case of a small capacitance value of the capacitor Csense 112 according to FIG. 4. The output signals 118 and 117 are generated by the delay measurement units 104 and 103 to represent the delay time of the delay cell (DC-R) 102 and the delay cell (DC-S) 101 respectively. The Vref signal 414 is a constant reference voltage. At the beginning of period A, the result of the internal comparator 415 between the Vref signal 414 and the Vint signal 413 is stored and used to control the mean 108. In this case, the Vint signal 413 is higher than the Vref signal 414 hence the output signal 418 is equal to logic '1' for the entire of the period A. The mean 108 connects the capacitor Cmax 114 to the delay cell (DC-R) 102 to increase its delay time. The delay difference between the delay cell (DC-R) 102 and the delay cell (DC-S) 101 is accumulated by using the output signals 118 and 117. The capacitor Cint 412 is discharged by the current source I-discharge 411, which is controlled by the output signal 118. The capacitor Cint 412 is charged by the current source I-charge 410, which is controlled by the output signal 117. In one embodiment, the current source I-charge 410 may have the same current value as the current source I-discharge 411. At the beginning of period B, the Vint signal 413 is lower than the Vref signal 414 and the result is stored. Thus, the output signal 418 is equal to logic '0' in period B and it disconnects the capacitor Cmax 114 from the delay cell (DC-R) 102, which decreases the delay time of the delay cell (DC-R) 102. As a result, the Vint signal 413 is lower than the Vref signal 414 and the result is stored to use in period C. The delay difference accumulation process continues in period D, period E, period F, and so on. When the delay balancing loop for measurement of capacitance and delay balancing loop method thereof has reached a steady state, the average delay time of the delay cell (DC-R) 102 is equal to the average delay time of the delay cell (DC-S) 101.

Figure 6:
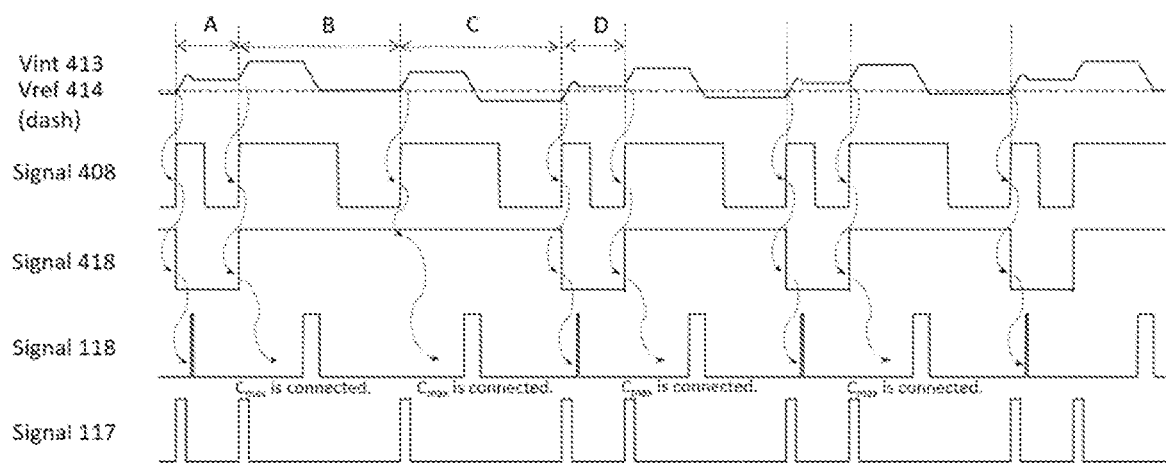
FIG. 6 is exemplary internal signals of delay balancing loop for measurement of capacitance and delay balancing loop method thereof, for large Csense according to FIG. 4.

FIG. 6 shows exemplary internal signals of delay balancing loop for measurement of capacitance and delay balancing loop method thereof, in case of a large capacitance value of the capacitor Csense 112 according to FIG. 4. It displays the signals of the delay balancing loop for measurement of capacitance and delay balancing loop method thereof in FIG. 4 during capacitance measurement at another value of sensing capacitor, which is larger than the sensing capacitor in the operation loop in FIG. 5. If the Vint signal 413 is lower than the Vref signal 414, the result will be stored and the output signal 418 will be logic '0', as shown in period A in FIG. 6. It disconnects the capacitor Cmax 114 from the delay cell (DC-R) 102 and decreases the delay time of the delay cell (DC-R) 102 and the shape of the output signal 118. The capacitor Cmax 114 is disconnected from the delay cell (DC-R) 102 until the Vint signal 413 is higher than the Vref signal 414 as observed at the beginning of period B. As a result, the output signal 418 will be logic '1' in period B and the capacitor Cmax 114 is connected to the delay cell (DC-R) 102 to increase the delay time of the delay cell (DC-R) 102. At the beginning of period C, the Vint signal 413 is still higher than the Vref signal 414 and makes the output signal 418 stay at logic '1' in period C. The capacitor Cmax 114 keeps connecting with the delay cell (DC-R) 102 to make the shape of the output signal 118 like the one in period B. It makes the Vint signal 413 lower than the Vref signal 414, the output signal 418 in period D will be at logic '0'. Thus, the capacitor Cmax 114 is disconnected from the delay cell (DC-R) 102, which decreases the delay time of the delay cell (DC-R) 102. The feedback control loop continues until it reaches a steady state that makes the average delay time of the delay cell (DC-R) 102 equal to the average delay time of the delay cell (DC-S) 101.

According to FIGS. 5 and 6, the duty cycle or the average value of the output signal 418 can represent the sensing capacitance value. It means that the larger the sensing capacitance value Csense 112, the longer the output signal 418 stays at logic '1' thus it has a large duty cycle or a large average value. For a small sensing capacitance Csense 112, the output signal 418 stays longer at the logic 'O' thus it has a small duty cycle or a small average value.

Figure 7:
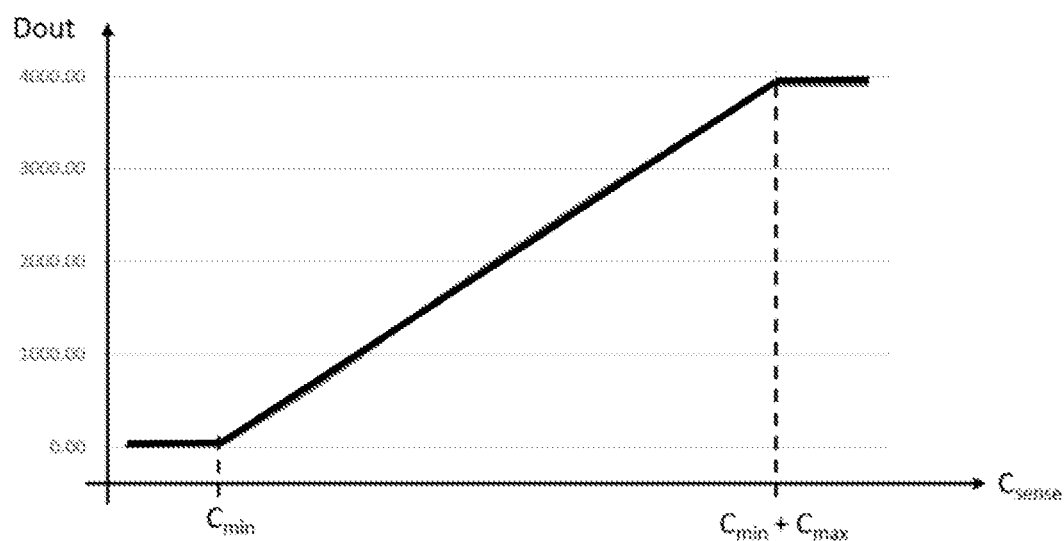
FIG. 7 is an exemplary characteristic curve of capacitance measurement by delay balancing loop for measurement of capacitance and delay balancing loop method thereof.

FIG. 7 shows an exemplary characteristic curve of capacitance measurement by delay balancing loop for measurement of capacitance and delay balancing loop method thereof. The output calculation unit 107 can be implemented by an internal counter circuit 419. It counts for the duration which the output signal 418 stays at logic '1', according to FIG. 4. With a larger sensing capacitance Csense 112, the delay balancing loop makes the output signal 418 stay at logic "1" longer, hence the internal counter circuit 419 provides a larger output value (Dout) 420. If the capacitance Csense 112 is equal to Cmin, the duty cycle of the output signal 418 is 0% or the output signal 418 is always at logic '0', thus the value of the output signal 420 is equal to zero. If the capacitance Csense 112 is equal to Cmin+Cmax, the duty cycle of the output signal 418 is 100% or the output signal 418 is always at logic '1', thus the value of the output signal 420 is a maximum value of the counter output.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A delay balancing loop for measurement of capacitance and delay balancing loop method thereof and delay balancing loop method thereof comprising:
   at least two delay cells configured to delay input signals to delay management units;
   at least one delay management unit configured to:
      measure delay times of the two delay cells;
      compare and find differences of the delay times of the two delay cells;
      accumulate the differences of the delay times of the two delay cells;
      send accumulated result to a feedback control unit;
   at least one feedback control unit configured to:
      adjust the delay time of one of the at least two delay cells based on the accumulated result from the delay management unit by sending an adjusted result to control a mean;
      send the adjusted result to an output calculation unit;
   at least one output calculation unit configured to calculate the duration of the adjusted result from the feedback control unit and generate an output signal; and
   at least one mean configured to adjust the delay time of one of the at least two delay cells by the adjusted result from the feedback control unit by at least two patterns.

2. The delay balancing loop according to claim 1, wherein a first delay cell (DC-S) is a delay cell whose delay time depends on a first capacitance (Csense) that is being measured and a second delay cell (DC-R) is a delay cell whose delay time depends on a second capacitance (Cmin) and the mean, which is a switch and a third capacitance (Cmax).

3. The delay balancing loop according to claim 1, wherein the delay management unit comprises:
   at least two delay measurement units, wherein a first delay measurement unit is configured to measure the delay time of the first delay cell (DC-S) by using a first input signal and a first output signal of the first delay cell (DC-S) to generate a first impulse signal whose duration is equal to the delay time of the first delay cell (DC-S), wherein a second delay measurement unit is configured to measure the delay time of the second delay cell (DC-R) by using a second input signal and a second output signal of the second delay cell (DC-R) to generate a second impulse signal whose duration is equal to the delay time of the second delay cell (DC-R); and at least one delay comparison and error accumulation unit configured to compare the first impulse signal from the first delay measurement unit with the second impulse signal from the second delay measurement unit, and generating an error accumulation signal.

4. The delay balancing loop according to claim 1, wherein the feedback control unit is configured to receive the error accumulation signal and generate a feedback control signal to control the mean to adjust the delay time of the second delay cell (DC-R), wherein the mean either increases or decreases the delay time of the second delay cell (DC-R) by using at least two patterns.

5. The delay balancing loop according to claim 4, wherein the at least two patterns are:
- if the feedback control signal is logic 1, the mean increases the delay time of the second delay cell (DC-R); and
- if the feedback control signal is logic 0, the mean decreases the delay time of the second delay cell (DC-R).

6. The delay balancing loop according to claim 1, wherein the mean comprises at least one switch and at least one capacitor or at least one varactor.

7. A delay balancing loop method comprising:
- generating a first input signal and a first output signal from a first delay cell (DC-S) and a second input signal and a second output signal from a second delay cell (DC-R);
- measuring a first delay time of the first delay cell (DC-S) and generating a first impulse signal and measuring a second delay time of the second delay cells (DC-R) and generating a second impulse signal;
- calculating the difference between the durations of the first impulse signal and the second impulse signal;
- accumulating the differences between the durations of the first impulse signal and the second impulse signal to generate an error accumulation signal;
- generating the feedback control signal by using an error accumulation signal; and
- adjusting the delay time of the second delay cell (DC-R) using the error accumulation signal with at least two patterns;
- calculating an output from the error accumulation signal by the output calculation unit.

8. The delay balancing loop method of claim 7, wherein the duration of the first impulse signal is equal to the delay time of the first delay cell (DC-S) and the duration of the second impulse signal is equal to the delay time of the second delay cell (DC-R).

9. The delay balancing loop method of claim 7,
- wherein the delay management unit measures the delay times of the first delay cell (DC-S) and the second delay cell (DC-R);
- wherein the delay management unit compares the duration of the first impulse signal and the second impulse signal to calculate the time delay differences of the first delay cell (DC-S) and the second delay cells (DC-R); and
- wherein the delay management unit accumulates the time delay differences of the first delay cell (DC-S) and the second delay cells (DC-R), and sending an error accumulation signal to the feedback control unit.

10. The delay balancing loop method of claim 7, wherein the feedback control unit is adjusting the delay time of the second delay cell (DC-R) by following at least two patterns, wherein the two patterns are:
- if the feedback control signal is logic 1, a mean increases the delay time of the second delay cell (DC-R); and
- if the feedback control signal is logic 0, the mean decreases the delay time of the second delay cell (DC-R).

* * * * *